(12) United States Patent
Sakamoto et al.

(10) Patent No.: US 12,224,220 B2
(45) Date of Patent: Feb. 11, 2025

(54) SEMICONDUCTOR MODULE AND POWER CONVERSION APPARATUS

(71) Applicant: Mitsubishi Electric Corporation, Tokyo (JP)

(72) Inventors: Ken Sakamoto, Tokyo (JP); Haruko Hitomi, Tokyo (JP); Kozo Harada, Tokyo (JP); Seiki Hiramatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 474 days.

(21) Appl. No.: 17/781,713

(22) PCT Filed: Feb. 6, 2020

(86) PCT No.: PCT/JP2020/004613
§ 371 (c)(1),
(2) Date: Jun. 2, 2022

(87) PCT Pub. No.: WO2021/157024
PCT Pub. Date: Aug. 12, 2021

(65) Prior Publication Data
US 2023/0024580 A1    Jan. 26, 2023

(51) Int. Cl.
*H01L 23/31*       (2006.01)
*H01L 23/00*       (2006.01)
(Continued)

(52) U.S. Cl.
CPC ...... *H01L 23/3135* (2013.01); *H01L 23/3142* (2013.01); *H01L 24/05* (2013.01);
(Continued)

(58) Field of Classification Search
CPC .............................................. H01L 2224/4569
See application file for complete search history.

(56) References Cited

U.S. PATENT DOCUMENTS

2008/0258316 A1    10/2008   Tamba et al.
2017/0228759 A1*   8/2017    Haese .................... G07F 17/16
(Continued)

FOREIGN PATENT DOCUMENTS

DE    112019003664 T5    4/2021
JP    H06-333970 A       12/1994
(Continued)

OTHER PUBLICATIONS

Office Action issued on Jun. 25, 2024, in corresponding German patent Application No. 11 2020 006 683.5, 12 pages.
(Continued)

*Primary Examiner* — Grant S Withers
(74) *Attorney, Agent, or Firm* — XSENSUS LLP

(57) ABSTRACT

A semiconductor module includes a first power semiconductor device, a conductive wire, and a resin film. The conductive wire is joined to a surface of a first front electrode of the first power semiconductor device. The resin film is formed to be continuous on at least one of an end portion or an end portion of a first joint between the first front electrode and the conductive wire in a longitudinal direction of the conductive wire, a surface of the first front electrode, and a surface of the conductive wire. The resin film has an elastic elongation rate of 4.5% to 10.0%.

13 Claims, 5 Drawing Sheets

(51) Int. Cl.
*H01L 25/065* (2023.01)
*H01L 25/07* (2006.01)
*H01L 25/18* (2023.01)
*H02M 7/5387* (2007.01)
*H01L 23/29* (2006.01)
*H02M 1/08* (2006.01)

(52) U.S. Cl.
CPC .............. *H01L 24/42* (2013.01); *H01L 24/44* (2013.01); *H01L 24/45* (2013.01); *H01L 24/47* (2013.01); *H01L 24/48* (2013.01); *H01L 25/0655* (2013.01); *H01L 25/072* (2013.01); *H01L 25/18* (2013.01); *H02M 7/5387* (2013.01); *H01L 23/293* (2013.01); *H01L 23/296* (2013.01); *H01L 2224/05573* (2013.01); *H01L 2224/05624* (2013.01); *H01L 2224/4501* (2013.01); *H01L 2224/45124* (2013.01); *H01L 2224/45147* (2013.01); *H01L 2224/45155* (2013.01); *H01L 2224/45157* (2013.01); *H01L 2224/4516* (2013.01); *H01L 2224/45599* (2013.01); *H01L 2224/4569* (2013.01); *H01L 2224/48137* (2013.01); *H01L 2224/48175* (2013.01); *H01L 2924/1811* (2013.01); *H01L 2924/1815* (2013.01); *H01L 2924/182* (2013.01); *H01L 2924/186* (2013.01); *H01L 2924/35121* (2013.01); *H02M 1/08* (2013.01)

(56) References Cited

U.S. PATENT DOCUMENTS

| | | |
|---|---|---|
| 2017/0236819 A1 | 8/2017 | Kanai et al. |
| 2017/0338169 A1* | 11/2017 | Mahler ............... H01L 23/3142 |
| 2021/0305175 A1 | 9/2021 | Abe et al. |
| 2022/0045031 A1* | 2/2022 | Knipper ................. H01L 24/77 |

FOREIGN PATENT DOCUMENTS

| | | |
|---|---|---|
| JP | 2011-228336 A | 11/2011 |
| JP | 2017-143185 A | 8/2017 |
| JP | 2017-147327 A | 8/2017 |
| JP | 2017-224778 A | 12/2017 |
| WO | 2015/152373 A1 | 10/2015 |

OTHER PUBLICATIONS

International Search Report and Written Opinion mailed on Apr. 7, 2020, received for PCT Application PCT/JP2020/004613, Filed on Feb. 6, 2020, 8 pages including English Translation.

* cited by examiner

SEMICONDUCTOR MODULE AND POWER CONVERSION APPARATUS

CROSS-REFERENCE TO RELATED APPLICATION

The present application is based on PCT filing PCT/JP2020/004613, filed Feb. 6, 2020, the entire contents of which are incorporated herein by reference.

TECHNICAL FIELD

The present disclosure relates to a semiconductor module and a power conversion apparatus.

BACKGROUND ART

Japanese Patent Laying Open No. 2017-147327 (PTL 1) discloses a semiconductor device including a power semiconductor device, a wire, a resin layer, and a gel filler material. The wire is joined to an electrode of the power semiconductor device. The resin layer covers a joint between the electrode of the power semiconductor device and the wire. The gel filler material seals the power semiconductor device, the wire, and the resin layer.

CITATION LIST

Patent Literature

PTL 1: Japanese Patent Laying-Open No. 2017-147327

SUMMARY OF INVENTION

Technical Problem

In the semiconductor device disclosed in PTL 1, thermal stress is repeatedly applied to the joint between the electrode of the power semiconductor device and the wire during use of the semiconductor device. The resin layer therefore sometimes peels off from at least one of the electrode of the power semiconductor device, the wire, or the joint between the electrode of the power semiconductor device and the wire to cause cracking at the joint between the electrode of the power semiconductor device and the wire or peeling of the wire from the electrode of the power semiconductor device. The present disclosure is made in view of the problem above and an object of the present disclosure is to provide a semiconductor module and a power conversion apparatus having improved reliability.

Solution to Problem

A semiconductor module according to the present disclosure includes a first power semiconductor device, a conductive wire, and a resin film. The first power semiconductor device includes a first electrode. The conductive wire is joined to a first surface of the first electrode. The resin film is formed to be continuous on a first end portion of a first joint between the first electrode and the conductive wire in a longitudinal direction of the conductive wire, the first surface of the first electrode, and a second surface of the conductive wire. The resin film has an elastic elongation rate of 4.5% to 10.0%.

A power conversion apparatus according to the present disclosure includes a main conversion circuit and a control circuit. The main conversion circuit includes the semiconductor module according to the present disclosure and converts input power and outputs the converted power. The control circuit outputs a control signal for controlling the main conversion circuit to the main conversion circuit.

Advantageous Effects of Invention

Since the resin film has an elastic elongation rate of 4.5% or more, the resin film can follow thermal expansion and thermal shrinkage of the members such as the first electrode of the first power semiconductor device and the conductive wire included in the semiconductor module. The resin film does not peel off from the first end portion of the first joint, the surface of the first electrode, and the surface of the conductive wire. The resin film keeps alleviating thermal stress applied to the first joint. The resin film can prevent cracking in the first joint or peeling of the conductive wire from the first electrode. The lifetime of the semiconductor module and the power conversion apparatus is prolonged, and the semiconductor module and the power conversion apparatus have improved reliability.

DESCRIPTION OF EMBODIMENTS

Embodiments of the present disclosure will be described below. The same configuration is denoted by the same reference number and a description thereof will not be repeated.

First Embodiment

Figure 1:
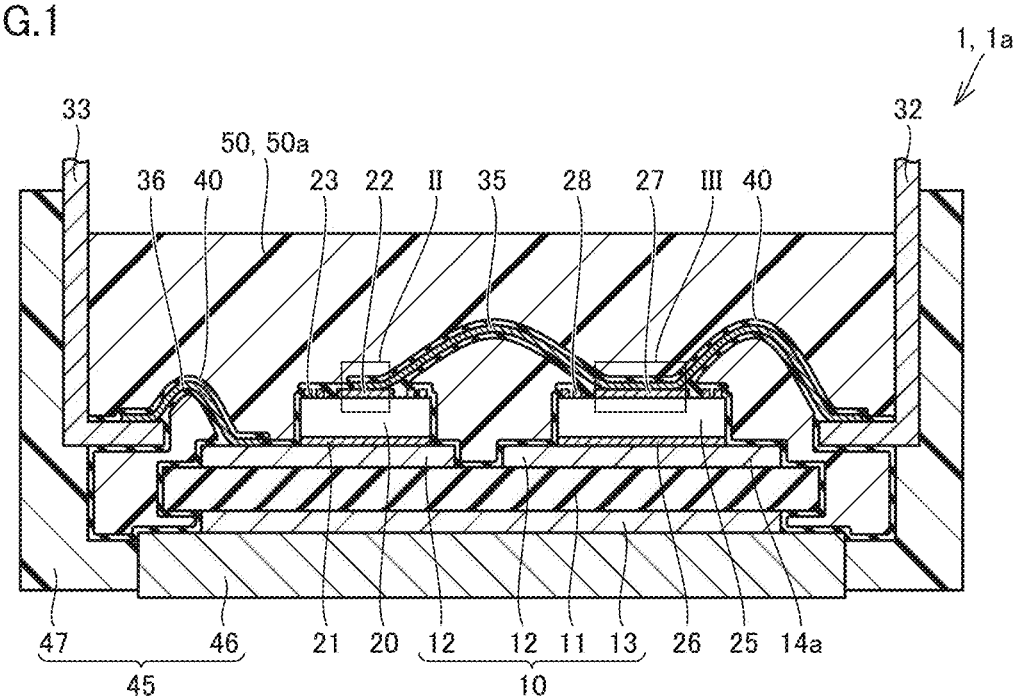
FIG. 1 is a schematic sectional view of a semiconductor module in first and second embodiments.
Figure 2:
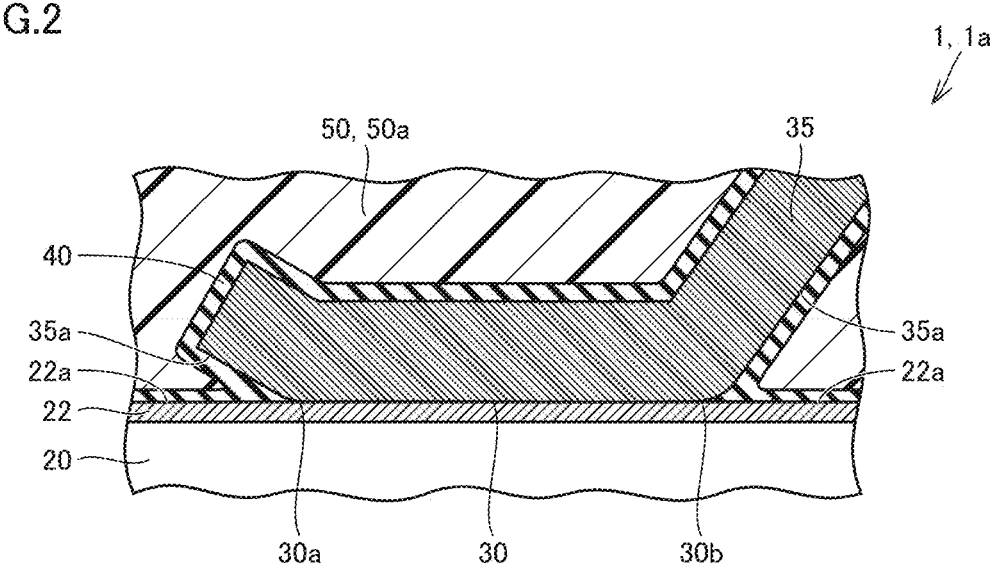
FIG. 2 is a partially enlarged schematic sectional view of region II illustrated in FIG. 1 in the semiconductor module in the first and second embodiments.
Figure 3:
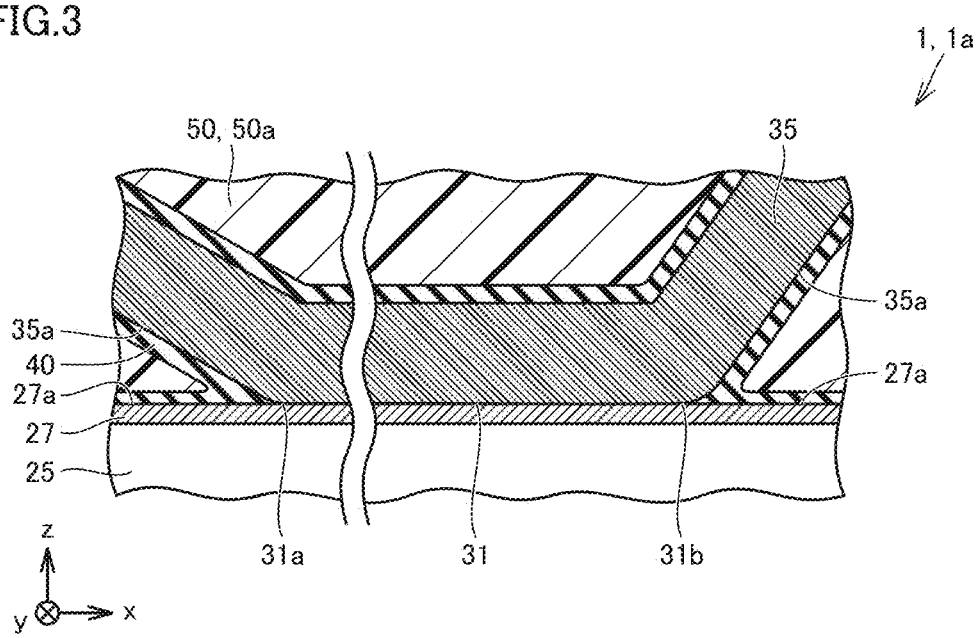
FIG. 3 is a partially enlarged schematic sectional view of region III illustrated in FIG. 1 in the semiconductor module in the first and second embodiments.

Referring to FIG. 1 to FIG. 3, a semiconductor module 1 in a first embodiment will be described. Semiconductor module 1 mainly includes a first power semiconductor device 20, a second power semiconductor device 25, conductive wires 35 and 36, a resin film 40, a first electrode terminal 32, and a second electrode terminal 33. Semiconductor module 1 may further include an insulated circuit board 10, a case 45, and a sealing member 50.

Insulated circuit board 10 includes an insulating substrate 11. Insulating substrate 11 includes a front surface and a rear surface on the side opposite to the front surface. Insulating substrate 11 is formed of a ceramic material such as alumina ($Al_2O_3$), aluminum nitride (AlN), or silicon nitride ($Si_3N_4$). Insulated circuit board 10 includes a conductive circuit pattern 12 and a conductive plate 13. Conductive circuit pattern 12 is provided on the front surface of insulating substrate 11. Conductive plate 13 is provided on the rear surface of insulating substrate 11. Conductive circuit pattern 12 and conductive plate 13 are formed of, for example, a metal material such as copper (Cu) or aluminum (Al).

First power semiconductor device 20 is, for example, a switching element such as an insulated gate bipolar transistor (IGBT) or a metal oxide semiconductor field-effect transistor (MOSFET), or a diode such as a freewheeling diode. First power semiconductor device 20 is mainly formed of a semiconductor material such as silicon, silicon carbide, gallium nitride, or diamond.

First power semiconductor device 20 includes a first back electrode 21 and a first front electrode 22. First back electrode 21 is provided on a first back face of first power semiconductor device 20. First back electrode 21 is joined to conductive circuit pattern 12 using a conductive joint member (not illustrated) such as solder or sintered metal nanoparticles. First front electrode 22 is provided on a first front face of first power semiconductor device 20 on the side opposite to the first back face. First front electrode 22 and the second back electrode are formed of, for example, aluminum or an Al alloy containing Si.

First power semiconductor device 20 may further include a first guard ring 23. First guard ring 23 is provided in a peripheral region of the first front face of first power semiconductor device 20. In a plan view of the first front face, first guard ring 23 surrounds first front electrode 22. First guard ring 23 is formed of, for example, the same conductive material as first front electrode 22.

Second power semiconductor device 25 is, for example, a switching element such as an insulated gate bipolar transistor (IGBT) or a metal oxide semiconductor field-effect transistor (MOSFET), or a diode such as a freewheeling diode. Second power semiconductor device 25 is mainly formed of a semiconductor material such as silicon, silicon carbide, gallium nitride, or diamond.

Second power semiconductor device 25 includes a second back electrode 26 and a second front electrode 27. Second back electrode 26 is provided on a second back face of second power semiconductor device 25. Second back electrode 26 is joined to conductive circuit pattern 12 using a conductive joint member (not illustrated) such as solder or sintered metal nanoparticles. Second front electrode 27 is provided on a second front face of second power semiconductor device 25 on the side opposite to the second back face. Second front electrode 27 and second back electrode 26 are formed of, for example, aluminum or an Al alloy containing Si.

Second power semiconductor device 25 may further include a second guard ring 28. Second guard ring 28 is provided in a peripheral region of the second front face of second power semiconductor device 25. In a plan view of the second front face, second guard ring 28 surrounds second front electrode 27. Second guard ring 28 is formed of, for example, the same conductive material as second front electrode 27.

First electrode terminal 32 and second electrode terminal 33 are provided at an enclosure 47 that constitutes case 45. First electrode terminal 32 and second electrode terminal 33 are formed of, for example, a metal material such as copper or aluminum.

As illustrated in FIG. 1 and FIG. 2, conductive wire 35 is joined to a surface 22a of first front electrode 22. Conductive wire 35 is joined to first front electrode 22 of first power semiconductor device 20 at a first joint 30. First joint 30 is a joint surface between surface 22a of first front electrode 22 and a surface 35a of conductive wire 35. As illustrated in FIG. 1 and FIG. 3, conductive wire 35 is joined to a surface 27a of second front electrode 27. Conductive wire 35 is joined to second front electrode 27 of second power semiconductor device 25 at a second joint 31. Second joint 31 is a joint surface between surface 27a of second front electrode 27 and surface 35a of conductive wire 35. Conductive wire 35 is joined to first electrode terminal 32 by wire bonding.

Conductive wire 36 is joined to second electrode terminal 33 and conductive circuit pattern 12 by wire bonding. Conductive wires 35 and 36 are formed of, for example, copper, iron, nickel, cobalt, aluminum, or an alloy thereof.

Resin film 40 has electrical insulating properties. As illustrated in FIG. 2, resin film 40 is formed to be continuous on an end portion 30a of first joint 30 between first front electrode 22 and conductive wire 35 in the longitudinal direction (the horizontal direction in FIG. 2) of conductive wire 35, surface 22a of first front electrode 22, and surface 35a of conductive wire 35. Resin film 40 is formed to be continuous on an end portion 30b of first joint 30 between first front electrode 22 and conductive wire 35 in the longitudinal direction of conductive wire 35, surface 22a of first front electrode 22, and surface 35a of conductive wire 35.

As illustrated in FIG. 3, resin film 40 is formed to be continuous on an end portion 31a of second joint 31 between second front electrode 27 and conductive wire 35 in the longitudinal direction of conductive wire 35, surface 27a of second front electrode 27, and surface 35a of conductive wire 35. Resin film 40 is formed to be continuous on an end portion 31b of second joint 31 between second front electrode 27 and conductive wire 35 in the longitudinal direction of conductive wire 35, surface 27a of second front electrode 27, and surface 35a of conductive wire 35.

As illustrated in FIG. 1, resin film 40 may be formed on the entire conductive wire 35 between first joint 30 and second joint 31. Resin film 40 is formed to be continuous on at least one of the end portions of the joint between first front electrode 32 and conductive wire 35 in the longitudinal direction of conductive wire 35, a surface of first electrode terminal 32, and surface 35a of conductive wire 35. Resin film 40 is formed to be continuous on at least one of the end portions of the joint between second electrode terminal 33 and conductive wire 36 in the longitudinal direction of conductive wire 36, a surface of second electrode terminal 33, and a surface of conductive wire 36. Resin film 40 is formed to be continuous on at least one of the end portions of the joint between conductive circuit pattern 12 and conductive wire 36 in the longitudinal direction of conductive wire 36, a surface of conductive circuit pattern 12, and a surface of conductive wire 36. Resin film 40 may be formed on the entire conductive wires 35 and 36.

As illustrated in FIG. 1, resin film 40 further covers first guard ring 23 and second guard ring 28. Resin film 40 is in contact with sealing member 50 and first guard ring 23. Resin film 40 is in contact with sealing member 50 and second guard ring 28.

Resin film 40 may be further formed on a surface of insulated circuit board 10 exposed from first power semiconductor device 20 and second power semiconductor device 25. Resin film 40 may be further formed on a portion of first electrode terminal 32 to which conductive wire 35 is joined. Resin film 40 may be further formed on a portion of second electrode terminal 33 to which conductive wire 36 is joined. Resin film 40 may be further formed on a surface of a base plate 46 exposed from insulated circuit board 10.

Resin film 40 may be further formed on a surface of enclosure 47 located between the electrode terminal (first electrode terminal 32, second electrode terminal 33) and base plate 46. Resin film 40 is formed by, for example, dispensing, electrodeposition, electrostatic spray deposition, spin coating, liquid immersion, or spray coating.

Figure 4:
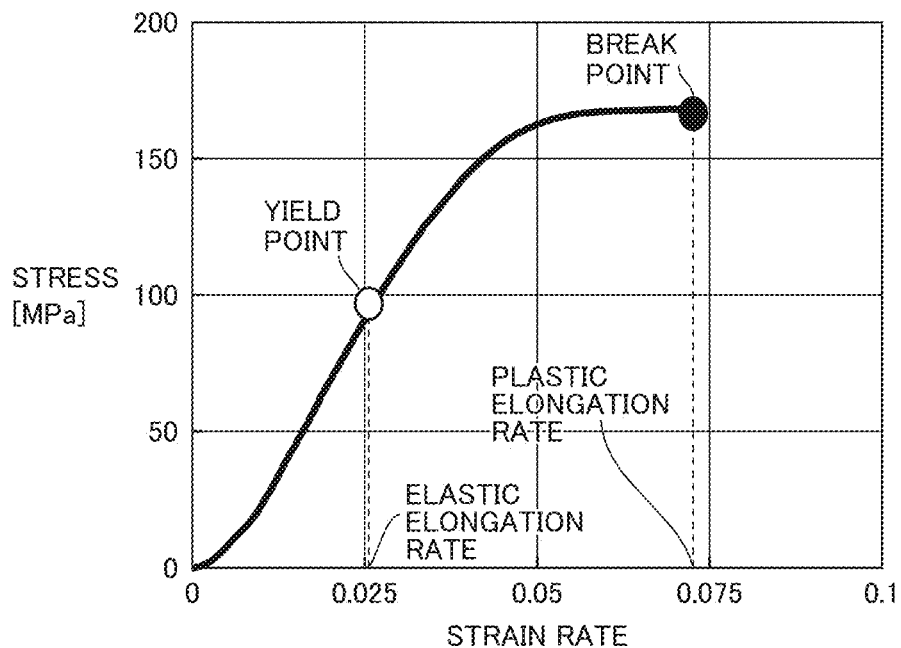
FIG. 4 is a graph illustrating the definition of the elastic elongation rate of a resin film.

Resin film 40 is softer than first front electrode 22, second front electrode 27, and conductive wires 35 and 36. The elastic elongation rate of resin film 40 is 4.5% to 10.0%. The elastic elongation rate of resin film 40 is defined by the strain rate of resin film 40 at the yield point of resin film 40 (see FIG. 4) in a tensile test defined in JIS K7161. It is noted that the plastic elongation rate of resin film 40 is different from the elastic elongation rate of resin film 40. The plastic elongation rate of resin film 40 is defined by the strain rate of resin film 40 at the break point of resin film 40 (see FIG. 4) in a tensile test defined in JIS K7161. Resin film 40 is formed of, for example, a polyimide resin, an epoxy resin, or a silicone resin. An example of the epoxy resin applicable to resin film 40 is an underfill U8443-14 available from NAMICS CORPORATION. An example of the silicone resin applicable to resin film 40 is a silicone resin KE-210 available from Shin-Etsu Silicones.

The shear bond strength of resin film 40 to conductive wire 35, 36 is 8.0 MPa to 13.0 MPa. The shear bond strength of resin film 40 to first front electrode 22 of first power semiconductor device 20 is 8.0 MPa to 13.0 MPa. The shear bond strength of resin film 40 to second front electrode 27 of second power semiconductor device 25 is 8.0 MPa to 13.0 MPa. In the present description, the shear bond strength of a first member to a second member is the tensile stress at a point of time when the first member becomes separated from the second member when tensile stress is applied to the first member and the second member in a direction along the bonded interface between the first member and the second member and in directions opposite to each other. The shear bond strength is measured by the method defined in Japanese Industrial Standards (JIS) K6850.

Resin film 40 having an elastic elongation rate of 4.5% to 10.0% and a shear bond strength of 8.0 MPa to 13.0 MPa is formed of, for example, a polyimide resin defined by Formula (I) below. This polyimide resin is obtained by polymerizing an acid dihydrate including an alkyl group and a diamine including a benzene ring, an ether bond, and an alkyl group. Here, R1 represents $C_nH_{2n+1}$ (n is a natural number), and R2 represents $C_mH_{2m+1}$ (m is a natural number). The polyimide resin defined by Formula (I) has a long molecular chain and the molecular chain can rotate about the ether bond. The polyimide resin defined by Formula (I) below therefore is soft and has a high shear bond strength.

[Formula 1]

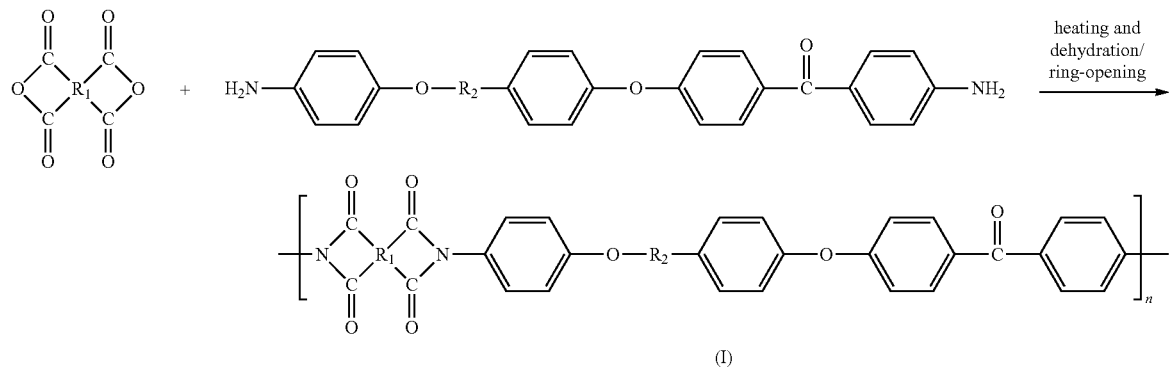

(I)

Case 45 includes base plate 46 and enclosure 47. Base plate 46 is formed of, for example, a metal such as copper or aluminum or an alloy such as aluminum-silicon carbide alloy (AlSiC) or copper-molybdenum alloy (CuMo). Conductive plate 13 of insulated circuit board 10 is joined to base plate 46. Base plate 46 can function as a heatsink. In a modification of the present embodiment, base plate 46 may be omitted and conductive plate 13 may serve the function of base plate 46 in the present embodiment.

Enclosure 47 has electrical insulating properties. Enclosure 47 is formed of an electrically insulating resin such as polyphenylene sulfide (PPS) resin or polybutylene terephthalate (PBT) resin. Base plate 46 and enclosure 47 are affixed to each other using an adhesive (not illustrated). This adhesive is formed of, for example, a silicone resin or an epoxy resin.

Sealing member 50 seals first power semiconductor device 20, second power semiconductor device 25, conductive circuit pattern 12, conductive wires 35 and 36, and resin film 40. Sealing member 50 may further seal insulating substrate 11. In the present embodiment, sealing member 50 is formed of a gel such as silicone gel. The second tensile modulus of the gel forming sealing member 50 is lower than the first tensile modulus of the resin material forming resin film 40. In the present description, the tensile modulus is measured by a tensile test defined in JIS K7161.

Figure 5:
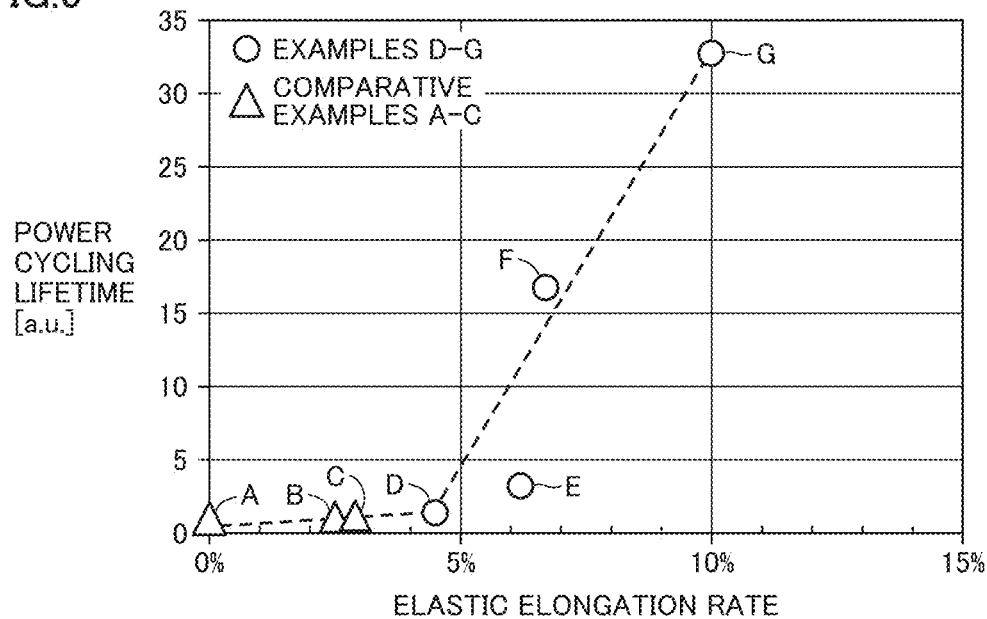
FIG. 5 is a graph illustrating the power cycling lifetime of semiconductor modules of Comparative Examples A to C and semiconductor modules of Examples D to G.

Referring to FIG. 5, the operation of semiconductor module 1 in the present embodiment will be described in comparison with comparative examples. FIG. 5 illustrates the power cycling lifetime of semiconductor modules of Comparative Examples A to C and semiconductor modules 1 of Examples D to G. A semiconductor module of Comparative Example A has a configuration similar to semiconductor module 1 in the present embodiment but does not include resin film 40. Semiconductor modules of Comparative Examples B and C have a configuration similar to semiconductor module 1 in the present embodiment, but resin film 40 included in the semiconductor modules of Comparative Examples B and C is a polyimide resin film having an elastic elongation rate of less than 4.5%. In semiconductor modules 1 of Examples D to G, resin film 40 is a polyimide resin film having an elastic elongation rate of 4.5% or more. Resin film 40 in semiconductor module 1 of Example G is a polyimide resin film represented by Formula (I) above.

A power cycling test of semiconductor module 1 is a test in which the lifetime (power cycling lifetime) of semiconductor module 1 is measured by alternately repeating a first step of feeding current to first power semiconductor device 20 or second power semiconductor device 25 and a second step of feeding no current to first power semiconductor device 20 and second power semiconductor device 25. As illustrated in FIG. 5, the power cycling lifetime of semiconductor module 1 has a correlation to the elastic elongation rate of resin film 40.

Specifically, when the semiconductor module does not include resin film 40 (Comparative Example A) or when the semiconductor module includes resin film 40 having an elastic elongation rate of less than 4.5% (Comparative Examples B and C), the power cycling lifetime of the semiconductor module is short. The reason is as follows. During a power cycling test of the semiconductor module, the members such as first front electrode 22, second front electrode 27, and conductive wire 35 included in the semiconductor module repeats thermal expansion and thermal shrinkage. Thus, thermal stress is repeatedly applied to first joint 30 between first front electrode 22 and conductive wire 35 and to second joint 31 between second front electrode 27 and conductive wire 35. Since the semiconductor module of Comparative Example A does not include resin film 40, this thermal stress causes cracking in first joint 30 or second joint 31 or peeling of conductive wire 35 from first front electrode 22 or second front electrode 27. The power cycling lifetime of the semiconductor module of Comparative Example A is therefore shortest.

In the semiconductor modules of Comparative Examples B and C, the elastic elongation rate of resin film 40 is less than 4.5% and relatively small. Resin film 40 therefore fails to sufficiently follow thermal expansion and thermal shrinkage of the members such as first front electrode 22, second front electrode 27, and conductive wire 35 included in semiconductor module 1. Resin film 40 peels off from end portions 30a, 30b of first joint 30, end portions 31a, 31b of second joint 31, surface 22a of first front electrode 22, surface 27a of second front electrode 27, or surface 35a of conductive wire 35 in fewer power cycles. Resin film 40 fails to alleviate thermal stress applied to first joint 30 and second joint 31 in fewer power cycles. The thermal stress causes cracking in first joint 30 or second joint 31 or peeling of conductive wire 35 from first front electrode 22 or second front electrode 27. The power cycling lifetime of the semiconductor modules of Comparative Examples B and C is longer than the power cycling lifetime of the semiconductor module of Comparative Example A, but the power cycling lifetime of the semiconductor modules of Comparative Examples B and C is still relatively short.

In comparison, when semiconductor module 1 includes resin film 40 having an elastic elongation rate of 4.5% to 10% (Examples D to G), the power cycling lifetime of semiconductor module 1 increases sharply with increase of the elastic elongation rate of resin film 40. The reason is as follows. In semiconductor modules 1 of Examples D to G, since the elastic elongation rate of resin film 40 is 4.5% or more, resin film 40 can sufficiently follow thermal expansion and thermal shrinkage of the members such as first front electrode 22, second front electrode 27, and conductive wire 35 included in semiconductor module 1. Resin film 40 does not peel off from end portions 30a, 30b of first joint 30, end portions 31a, 31b of second joint 31, surface 22a of first front electrode 22, surface 27a of second front electrode 27, and surface 35a of conductive wire 35 over more power cycles. Resin film 40 can alleviate thermal stress applied to first joint 30 and second joint 31 over more power cycles. Resin film 40 can prevent thermal stress from causing cracking in first joint 30 or second joint 31 or peeling of conductive wire 35 from first front electrode 22 or second front electrode 27. The power cycling lifetime of semiconductor modules 1 of Examples D to G is long.

The effects of semiconductor module 1 in the present embodiment will be described.

Semiconductor module 1 in the present embodiment includes first power semiconductor device 20, conductive wire 35, and resin film 40. First power semiconductor device 20 include a first electrode (first front electrode 22). Conductive wire 35 is joined to a first surface (surface 22a) of the first electrode (first front electrode 22). Resin film 40 is formed to be continuous on a first end portion (at least one of end portion 30a or end portion 30b) of first joint 30 between the first electrode (first front electrode 22) and conductive wire 35 in the longitudinal direction of conductive wire 35, the first surface (surface 22a) of the first electrode (first front electrode 22), and a second surface (surface 35a) of conductive wire 35. Resin film 40 has an elastic elongation rate of 4.5% to 10.0%.

Since resin film 40 has an elastic elongation rate of 4.5% or more, resin film 40 can follow thermal expansion and thermal shrinkage of the members such as the first electrode (first front electrode 22) of first power semiconductor device 20 and conductive wire 35 included in semiconductor module 1. Resin film 40 does not peel off from the first end portion (at least one of end portion 30a or end portion 30b) of first joint 30, the first surface (surface 22a) of the first electrode (first front electrode 22), and the second surface (surface 35a) of conductive wire 35. Resin film 40 keeps alleviating thermal stress applied to first joint 30. Resin film 40 can prevent cracking in first joint 30 or peeling of conductive wire 35 from the first electrode (first front electrode 22). The lifetime of semiconductor module 1 is prolonged and semiconductor module 1 has improved reliability.

In semiconductor module 1 in the present embodiment, the shear bond strength of resin film 40 to conductive wire 35 is 8.0 MPa to 13.0 MPa.

Since the shear bond strength of resin film 40 to conductive wire 35 is 8.0 MPa or more, resin film 40 is even less likely to peel off from surface 35a of conductive wire 35 during use of semiconductor module 1. Resin film 40 keeps alleviating thermal stress applied to first joint 30. Resin film 40 can prevent cracking in first joint 30 or peeling of conductive wire 35 from the first electrode (first front electrode 22). The lifetime of semiconductor module 1 is prolonged and semiconductor module 1 has improved reliability.

Since the shear bond strength of resin film 40 to conductive wire 35 is 13.0 MPa or less, the thickness of first joint 30 and conductive wire 35 on the periphery thereof is not excessively small when conductive wire 35 is bonded to the first electrode (first front electrode 22) of first power semiconductor device 20. Breakage of conductive wire 35 can be prevented when thermal stress is applied to conductive wire 35 during use of semiconductor module 1. The lifetime of semiconductor module 1 is prolonged and semiconductor module 1 has improved reliability.

Semiconductor module 1 in the present embodiment further includes sealing member 50. Sealing member 50 seals first power semiconductor device 20, conductive wire 35, and resin film 40. Sealing member 50 is formed of a gel. The second tensile modulus of the gel is lower than the first tensile modulus of the resin material forming resin film 40.

Although sealing member 50 is formed of a gel, the lifetime of semiconductor module 1 is prolonged and semiconductor module 1 has improved reliability, because of the provision of resin film 40.

In semiconductor module 1 in the present embodiment, first power semiconductor device 20 includes a guard ring (first guard ring 23). Resin film 40 covers the guard ring (first guard ring 23) and is in contact with sealing member 50 and the guard ring (first guard ring 23).

Since the guard ring (first guard ring 23) is provided in the peripheral region of first power semiconductor device 20, the dielectric strength of first power semiconductor device 20 is improved. Furthermore, resin film 40 prevents peeling of sealing member 50 from the guard ring (first guard ring 23) and thus formation of a void between sealing member 50 and the guard ring (first guard ring 23). The dielectric strength of first power semiconductor device 20 is therefore improved. Semiconductor module 1 has improved reliability.

Semiconductor module 1 further includes second power semiconductor device 25. Second power semiconductor device 25 includes a second electrode (second front electrode 27). Conductive wire 35 is joined to a third surface (surface 27*a*) of the second electrode (second front electrode 27). Resin film 40 is formed to be continuous on a second end portion (at least one of end portion 31*a* or end portion 31*b*) of second joint 31 between the second electrode (second front electrode 27) and conductive wire 35, the third surface (surface 27*a*) of the second electrode (second front electrode 27), and the second surface (surface 35*a*) of conductive wire 35 and is formed on the entire conductive wire 35 between first joint 30 and second joint 31.

Resin film 40 is formed to be continuous on a second end portion (at least one of end portion 31*a* or end portion 31*b*) of second joint 31 between the second electrode (second front electrode 27) of second power semiconductor device 25 and conductive wire 35, the third surface (surface 27*a*) of the second electrode (second front electrode 27), and the second surface (surface 35*a*) of conductive wire 35. Resin film 40 therefore can follow thermal expansion and thermal shrinkage of the members such as the second electrode (second front electrode 27) of second power semiconductor device 25 and conductive wire 35 included in semiconductor module 1. Resin film 40 does not peel off from the second end portion (at least one of end portion 31*a* or end portion 31*b*) of second joint 31, the third surface (surface 27*a*) of the second electrode (second front electrode 27), and the second surface (surface 35*a*) of conductive wire 35. Resin film 40 keeps alleviating thermal stress applied to second joint 31. Resin film 40 can prevent cracking in second joint 31 or peeling of conductive wire 35 from the second electrode (second front electrode 27). The lifetime of semiconductor module 1 is prolonged and semiconductor module 1 has improved reliability.

Resin film 40 is formed on the entire conductive wire 35 between first joint 30 and second joint 31. Resin film 40 is therefore even less likely to peel off from the second surface (surface 35*a*) of conductive wire 35. Resin film 40 can prevent cracking in first joint 30 and second joint 31 or peeling of conductive wire 35 from the first electrode (first front electrode 22) and the second electrode (second front electrode 27). The lifetime of semiconductor module 1 is prolonged and semiconductor module 1 has improved reliability.

Second Embodiment

Referring to FIG. 1 to FIG. 3, a semiconductor module 1*a* in a second embodiment will be described. Semiconductor module 1*a* in the present embodiment has a configuration similar to semiconductor module 1 in the first embodiment but differs mainly in the following points.

Semiconductor module 1*a* includes a sealing member 50*a* instead of sealing member 50 in the first embodiment. Sealing member 50*a* is formed of a thermosetting resin. The thermosetting resin mainly includes, for example, an epoxy resin, a urethane resin, a polyimide resin, or an acrylic resin. The third tensile modulus of the thermosetting resin is higher than the first tensile modulus of the resin material forming resin film 40. The thermosetting resin is harder than resin film 40 and sealing member 50 (first embodiment) formed of a gel. Sealing member 50*a* (the present embodiment) formed of a thermosetting resin therefore constrains conductive wire 35 stronger than resin film 40 and sealing member 50 (first embodiment) formed of a gel.

Semiconductor module 1*a* in the present embodiment has the following effects in addition to the effects of semiconductor module 1 in the first embodiment.

Semiconductor module 1*a* in the present embodiment further includes sealing member 50*a*. Sealing member 50*a* seals first power semiconductor device 20, conductive wire 35, and resin film 40. Sealing member 50*a* is formed of a thermosetting resin. The third tensile modulus of the thermosetting resin is higher than the first tensile modulus of the resin material forming resin film 40.

The thermosetting resin is harder than resin film 40 and sealing member 50 (first embodiment) formed of a gel. Sealing member 50*a* (the present embodiment) formed of a thermosetting resin therefore constrains conductive wire 35 stronger than resin film 40 and sealing member 50 (first embodiment) formed of a gel. Cracking in first joint 30 or peeling of conductive wire 35 from the first electrode (first front electrode 22) due to thermal stress can be prevented. The lifetime of semiconductor module 1*a* is prolonged and semiconductor module 1*a* has improved reliability.

Third Embodiment

Figure 6:
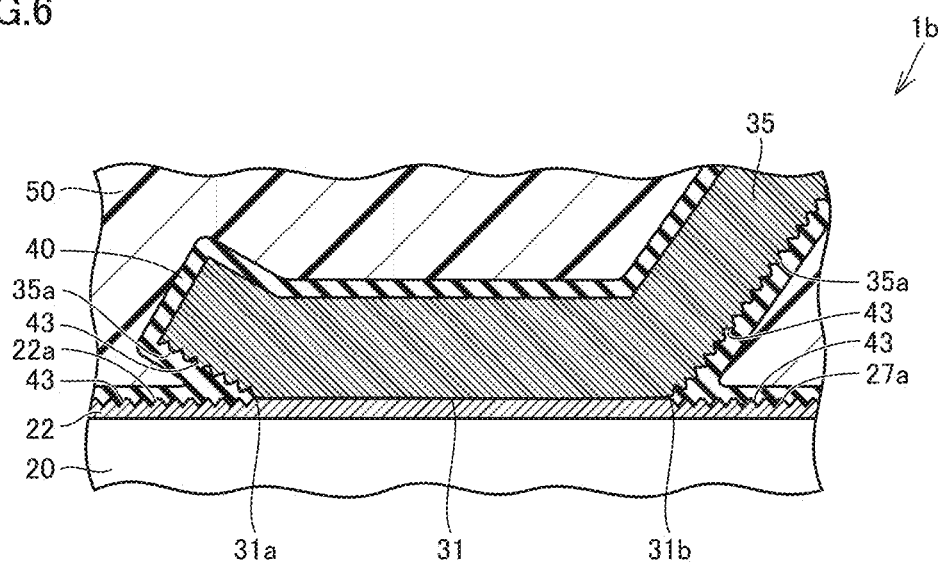
FIG. 6 is a partially enlarged schematic sectional view of a semiconductor module in a third embodiment.

Referring to FIG. 6, a semiconductor module 1*b* in a third embodiment will be described. Semiconductor module 1*b* in the present embodiment has a configuration similar to semiconductor module 1 in the first embodiment but differs mainly in the following points.

As illustrated in FIG. 6, at least one of surface 22*a* of first front electrode 22 of first power semiconductor device 20 or surface 35*a* of conductive wire 35 has a coarse surface 43. Specifically, coarse surface 43 is provided at both of surface 22*a* of first front electrode 22 of first power semiconductor device 20 and surface 35*a* of conductive wire 35. Coarse surface 43 may be connected to end portions 30*a*, 30*b* of first joint 30. Although not illustrated in the drawings, at least one of surface 27*a* of second front electrode 27 of second power semiconductor device 25 or surface 35*a* of conductive wire 35 may also have coarse surface 43. Specifically, coarse surface 43 may be provided at both of surface 27*a* of second front electrode 27 of second power semiconductor device 25 and surface 35*a* of conductive wire 35. Coarse surface 43 may be connected to end portions 31*a*, 31*b* of second joint 31. Resin film 40 is formed on coarse surface 43.

Semiconductor module 1*b* in the present embodiment has the following effects in addition to the effects of semiconductor module 1 in the first embodiment.

In semiconductor module 1*b* in the present embodiment, at least one of the first surface (surface 22*a*) of the first electrode (first front electrode 22) of first power semiconductor device 20 or the second surface (surface 35*a*) of conductive wire 35 has coarse surface 43. Resin film 40 is formed on coarse surface 43. Therefore, peeling of resin film 40 from at least one of the first surface (surface 22a) of the first electrode (first front electrode 22) of first power semiconductor device 20 or the second surface (surface 35a) of conductive wire 35 can be prevented. The power cycling lifetime of semiconductor module 1b is prolonged and semiconductor module 1b has improved reliability.

Fourth Embodiment

Figure 7:
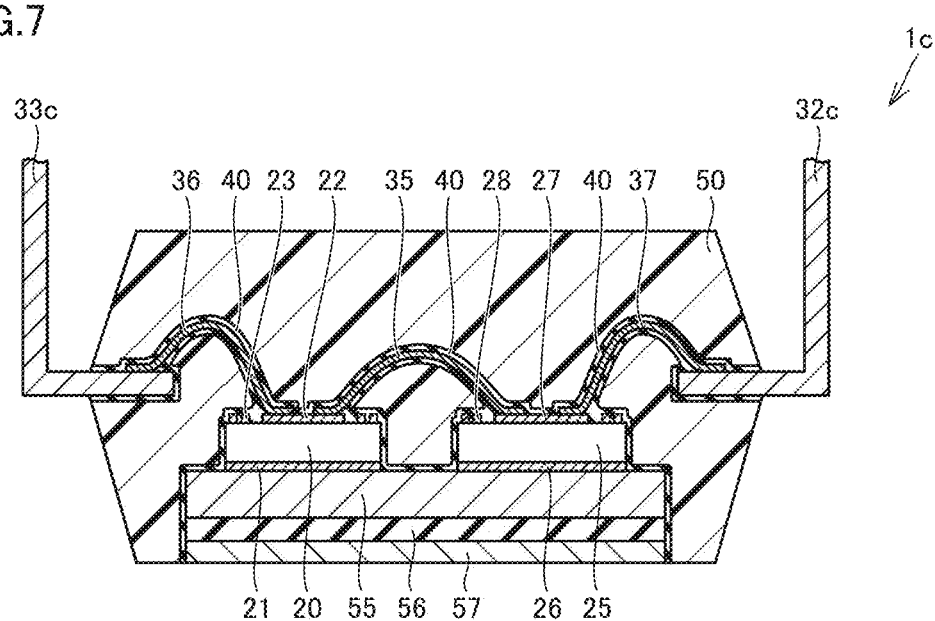
FIG. 7 is a schematic sectional view of a semiconductor module in a fourth embodiment.

Referring to FIG. 7, a semiconductor module 1c in a fourth embodiment will be described. Semiconductor module 1c in the present embodiment has a configuration similar to semiconductor module 1 in the first embodiment and has similar effects, but differs mainly in type of the semiconductor module. Specifically, semiconductor module 1c is a transfer-molded semiconductor module. Sealing member 50 is formed by transfer molding.

Semiconductor module 1c includes a heat spreader 55, an insulating plate 56, and a heatsink 57, instead of insulated circuit board 10 and base plate 46 (see FIG. 1). Semiconductor module 1c includes a first lead terminal 32c and a second lead terminal 33c, instead of first electrode terminal 32 and second electrode terminal 33 (see FIG. 1). Semiconductor module 1c further includes a conductive wire 37.

First power semiconductor device 20 and second power semiconductor device 25 are fixed to a front surface of heat spreader 55. For example, first power semiconductor device 20 and second power semiconductor device 25 are joined to the front surface of heat spreader 55, using a conductive joint member such as solder or sintered metal nanoparticles. Heat spreader 55 diffuses heat generated from first power semiconductor device 20 and second power semiconductor device 25. Heat spreader 55 is formed of, for example, a material having a high thermal conductivity, such as copper, aluminum, or graphite.

Heatsink 57 is provided on a rear surface of heat spreader 55 with insulating plate 56 interposed. Heatsink 57 is formed of, for example, a metal such as copper or aluminum or an alloy such as aluminum-silicon carbide alloy (AlSiC) or copper-molybdenum alloy (CuMo).

Insulating plate 56 electrically insulates heat spreader 55 from heatsink 57. Insulating plate 56 transfers heat generated from first power semiconductor device 20 and second power semiconductor device 25 and transmitted to heat spreader 55 to heatsink 57. Insulating plate 56 is formed of, for example, a ceramic material such as silicon nitride ($Si_3N_4$), aluminum nitride (AlN), alumina ($Al_2O_3$), or zirconium (Zr)-containing alumina.

Insulating plate 56 may be a resin insulating plate in which powder is dispersed. The powder may have a higher thermal conductivity than the resin forming the base material of the resin insulating plate. The powder may be, for example, ceramic powder formed of ceramics such as alumina ($Al_2O_3$), silicon dioxide ($SiO_2$), aluminum nitride (AlN), boron nitride (BN), or silicon nitride ($Si_3N_4$). The powder may be formed of diamond (C), silicon carbide (SiC), or boron oxide ($B_2O_3$). The powder may be, for example, powder of a resin such as a silicone resin or an acrylic resin. The base material of the resin insulating plate is, for example, an epoxy resin, a polyimide resin, a silicone resin, or an acrylic resin.

In semiconductor module 1c, conductive wire 35 is joined to first front electrode 22 of first power semiconductor device 20 and second front electrode 27 of second power semiconductor device 25 but is not joined to first lead terminal 32c. Conductive wire 36 is joined to first front electrode 22 of first power semiconductor device 20 and second lead terminal 33c. Conductive wire 37 is joined to second front electrode 27 of second power semiconductor device 25 and first lead terminal 32c.

Resin film 40 is formed not only on conductive wires 35 and 36 but also on conductive wire 37. Specifically, resin film 40 is formed to be continuous on at least one of the end portions of the joint between first front electrode 22 and conductive wire 36 in the longitudinal direction of conductive wire 36, a surface of first front electrode 22, and a surface of conductive wire 36. Resin film 40 is formed to be continuous on at least one of the end portions of the joint between first lead terminal 32c and conductive wire 36 in the longitudinal direction of conductive wire 36, a surface of first electrode terminal 32c, and a surface of conductive wire 36. Resin film 40 is formed to be continuous on at least one of the end portions of the joint between second front electrode 27 and conductive wire 37 in the longitudinal direction of conductive wire 37, a surface of second front electrode 27, and a surface of conductive wire 37. Resin film 40 is formed to be continuous on at least one of the end portions of the joint between second lead terminal 33c and conductive wire 37 in the longitudinal direction of conductive wire 37, a surface of second electrode terminal 33c, and a surface of conductive wire 37. Resin film 40 may be formed on the entire conductive wire 37.

Fifth Embodiment

In the present embodiment, any one of semiconductor modules 1, 1a, 1b, and 1c in the foregoing embodiments to the fourth embodiment is applied to a power conversion apparatus. Although the present disclosure is not limited to any particular power conversion apparatus, a case in which any one of semiconductor modules 1, 1a, 1b, and 1c in the present disclosure is applied to a three-phase inverter will be described below as a fifth embodiment.

Figure 8:
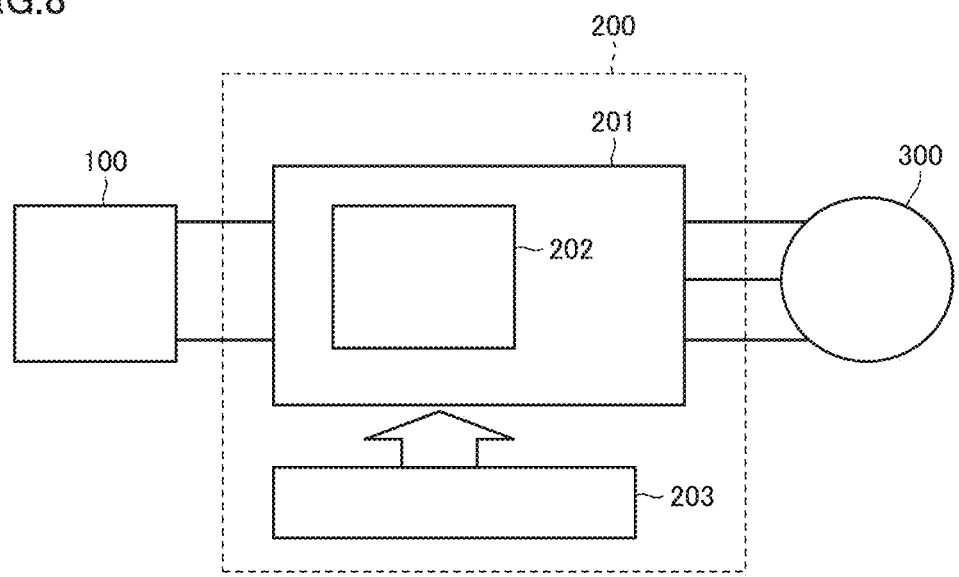
FIG. 8 is a block diagram illustrating a configuration of a power conversion system in a fifth embodiment.

A power conversion system illustrated in FIG. 8 includes a power source 100, a power conversion apparatus 200, and a load 300. Power source 100 is a DC power source and supplies DC power to power conversion apparatus 200. Power source 100 may be composed of, for example, but not limited to, a DC system, a solar battery, or a storage battery or may be composed of a rectifier circuit or an AC/DC converter connected to an AC system. Power source 100 may be composed of a DC/DC converter that converts DC power output from a DC system into another DC power.

Power conversion apparatus 200 is a three-phase inverter connected between power source 100 and load 300, and converts DC power supplied from power source 100 into AC power and supplies AC power to load 300. As illustrated in FIG. 8, power conversion apparatus 200 includes a main conversion circuit 201 to convert DC power into AC power and output AC power, and a control circuit 203 to output a control signal for controlling main conversion circuit 201 to main conversion circuit 201.

Load 300 is a three-phase motor driven by AC power supplied from power conversion apparatus 200. Load 300 is not limited to any particular applications and is a motor installed in a variety of electrical instruments and, for example, used as a motor for hybrid vehicles, electric vehicles, railroad vehicles, elevators, or air conditioners.

The detail of power conversion apparatus 200 will be described below. Main conversion circuit 201 includes switching elements (not illustrated) and freewheeling diodes (not illustrated). The switching elements switch a voltage supplied from power source 100, whereby main conversion circuit 201 converts DC power supplied from power source 100 into AC power and supplies AC power to load 300. There are a variety of circuit configurations of main conversion circuit 201. Main conversion circuit 201 according to the present embodiment may be a two-level three-phase full bridge circuit and include six switching elements and six freewheeling diodes connected in anti-parallel with the respective switching elements. At least any one of the switching elements and the freewheeling diodes of main conversion circuit 201 is a switching element or a freewheeling diode included in a semiconductor module 202 corresponding to any one of semiconductor modules 1, 1a, 1b, and 1c in the foregoing first to fourth embodiments. Six switching elements are connected in series two by two to form upper and lower arms, and the upper and lower arm constitutes each phase (U phase, V phase, W phase) of the full bridge circuit. The output terminals of the upper and lower arms, that is, three output terminals of main conversion circuit 201 are connected to load 300.

Main conversion circuit 201 also includes a drive circuit (not illustrated) to drive each switching element. The drive circuit may be contained in semiconductor module 202 or may be provided separately from semiconductor module 202. The drive circuit generates a drive signal for driving a switching element included in main conversion circuit 201 and supplies the drive signal to the control electrode of the switching element of main conversion circuit 201. Specifically, a drive signal to turn ON a switching element and a drive signal to turn OFF a switching element are output to the control electrode of each switching element, in accordance with the control signal from control circuit 203. When the switching element is kept ON, the drive signal is a voltage signal (ON signal) equal to or higher than a threshold voltage of the switching element. When the switching element is kept OFF, the drive signal is a voltage signal (OFF signal) equal to or lower than a threshold voltage of the switching element.

Control circuit 203 controls the switching elements of main conversion circuit 201 such that a desired power is supplied to load 300. Specifically, the time (ON time) in which each switching element of main conversion circuit 201 is to be turned ON is calculated based on power to be supplied to load 300. For example, main conversion circuit 201 can be controlled by pulse width modulation (PWM) control that modulates the ON time of switching elements in accordance with the voltage to be output. A control command (control signal) is output to a drive circuit of main conversion circuit 201 such that an ON signal is output to a switching element to be turned ON and an OFF signal is output to a switching element to be turned OFF at each point of time. The drive circuit outputs an ON signal or an OFF signal as a drive signal to the control electrode of each switching element, in accordance with the control signal.

In power conversion apparatus 200 according to the present embodiment, any one of semiconductor modules 1, 1a, 1b, and 1c in the first to fourth embodiments is applied as semiconductor module 202 that constitutes main conversion circuit 201. Power conversion apparatus 200 according to the present embodiment therefore achieves improved reliability.

In the present embodiment, the present disclosure is applied to a two-level three-phase inverter. However, the present disclosure is not limited thereto and can be applied to a variety of power conversion apparatuses. The present disclosure is applied to a two-level power conversion apparatus in the present embodiment, but may be applied to a three-level power conversion apparatus or a multi-level power conversion apparatus. When the power conversion apparatus supplies power to a single-phase load, the present disclosure may be applied to a single-phase inverter. When the power conversion apparatus supplies power to a DC load or the like, the present disclosure can also be applied to a DC/DC converter or an AC/DC converter.

The power conversion apparatus to which the present disclosure is applied is not limited to a case in which the load is a motor, and may be used as a power supply device for an electric discharge machine or a laser beam machine, or a power supply device for an induction heating cooker or a wireless charging system. The power conversion apparatus to which the present disclosure is applied can also be used as a power conditioner for photovoltaic systems or power storage systems.

REFERENCE SIGNS LIST 1, 1a, 1b, 1c semiconductor module, 10 insulated circuit board, 11 insulating substrate, 12 conductive circuit pattern, 13 conductive plate, 20 first power semiconductor device, 21 first back electrode, 22 first front electrode, 22a surface, 23 first guard ring, 25 second power semiconductor device, 26 second back electrode, 27 second front electrode, 27a surface, 28 second guard ring, 30 first joint, 30a, 30b end portion, 31 second joint, 31a, 31b end portion, 32 first electrode terminal, 32c first lead terminal, 33 second electrode terminal, 33c second lead terminal, 35, 36, 37 conductive wire, 35a surface, 40 resin film, 43 coarse surface, 45 case, 46 base plate, 47 enclosure, 50, 50a sealing member, 55 heat spreader, 56 insulating plate, 57 heatsink, 100 power source, 200 power conversion apparatus, 201 main conversion circuit, 203 control circuit, 300 load power supply.

The invention claimed is:

1. A semiconductor module comprising:
a first power semiconductor device including a first electrode;
a conductive wire joined to a first surface of the first electrode; and
a resin film formed to be continuous on a first end portion of a first joint between the first electrode and the conductive wire in a longitudinal direction of the conductive wire, the first surface of the first electrode, and a second surface of the conductive wire,
wherein the resin film has an elastic elongation rate of 4.5% to 10.0%.

2. The semiconductor module according to claim 1, wherein the resin film is formed of a polyimide resin, an epoxy resin, or a silicone resin.

3. The semiconductor module according to claim 1, wherein the resin film is formed of a resin material formed by polymerization of an acid dihydrate including an alkyl group and a diamine including a benzene ring, an ether bond, and an alkyl group.

4. The semiconductor module according to claim 1, wherein a shear bond strength of the resin film to the conductive wire is 8.0 MPa to 13.0 MPa.

5. The semiconductor module according to claim 1, further comprising a sealing member to seal the first power semiconductor device, the conductive wire, and the resin film, wherein
the sealing member is formed of a gel, and
a second tensile modulus of the gel is lower than a first tensile modulus of a resin material forming the resin film.

6. The semiconductor module according to claim 5, wherein the gel is silicone gel.

7. The semiconductor module according to claim 5, wherein
the first power semiconductor device includes a guard ring, and
the resin film covers the guard ring and is in contact with the sealing member and the guard ring.

8. The semiconductor module according to claim 1, further comprising a sealing member to seal the first power semiconductor device, the conductive wire, and the resin film, wherein
the sealing member is formed of a thermosetting resin, and
a third tensile modulus of the thermosetting resin is higher than a first tensile modulus of a resin material forming the resin film.

9. The semiconductor module according to claim 8, wherein the thermosetting resin mainly includes an epoxy resin, a urethane resin, a polyimide resin, a polyamide resin, or an acrylic resin.

10. The semiconductor module according to claim 1, wherein
at least one of the first surface or the second surface has a coarse surface, and
the resin film is formed on the coarse surface.

11. The semiconductor module according to claim 1, wherein the conductive wire is formed of copper, iron, nickel, cobalt, aluminum, or an alloy thereof.

12. The semiconductor module according to claim 1, further comprising a second power semiconductor device including a second electrode, wherein
the conductive wire is joined to a third surface of the second electrode, and
the resin film is formed to be continuous on a second end portion of a second joint between the second electrode and the conductive wire, the third surface of the second electrode, and the second surface of the conductive wire, and is formed on the entire conductive wire between the first joint and the second joint.

13. A power conversion apparatus comprising:
a main conversion circuit including the semiconductor module according to claim 1, the main conversion circuit converting input power and outputting the converted power; and
a control circuit to output a control signal for controlling the main conversion circuit to the main conversion circuit.

* * * * *